(12) United States Patent
Noto et al.

(10) Patent No.: US 10,271,426 B2
(45) Date of Patent: Apr. 23, 2019

(54) PRINTED WIRING BOARD

(71) Applicant: IBIDEN CO., LTD., Ogaki-shi (JP)

(72) Inventors: Hiroyasu Noto, Ogaki (JP); Yoshinori Takenaka, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 21 days.

(21) Appl. No.: 15/704,138

(22) Filed: Sep. 14, 2017

(65) Prior Publication Data
US 2018/0084640 A1   Mar. 22, 2018

(30) Foreign Application Priority Data
Sep. 16, 2016   (JP) .................................. 2016-181505

(51) Int. Cl.
*H01F 27/245* (2006.01)
*H01F 27/28* (2006.01)
(Continued)

(52) U.S. Cl.
CPC ....... *H05K 1/0306* (2013.01); *H01F 17/0013* (2013.01); *H01F 27/245* (2013.01);
(Continued)

(58) Field of Classification Search
CPC ... G11B 5/486; H01F 17/0013; H01F 27/245; H01F 27/28; H01F 27/2804; H01F 2027/2809; H01L 23/14; H01L 23/3735; H01L 23/49822; H01L 23/49833; H01L 24/48; H01L 2224/16225; H01L 2224/16227; H01L 2224/48227; H01L 2224/73204; H01L 2924/0002; H01L 2924/00014; H01L 2924/01012; H01L 2924/12042; H01L 2924/15311;
(Continued)

(56) References Cited

U.S. PATENT DOCUMENTS

| 2011/0120754 A1* | 5/2011 | Kondo | ..................... H01L 23/14 174/254 |
| 2011/0314669 A1* | 12/2011 | Stamper | .............. B81C 1/00365 29/846 |

(Continued)

FOREIGN PATENT DOCUMENTS

JP   2015-176884 A   10/2015

*Primary Examiner* — Timothy J Thompson
*Assistant Examiner* — Guillermo J Egoavil
(74) *Attorney, Agent, or Firm* — Oblon, McClelland, Maier & Neustadt, L.L.P.

(57) ABSTRACT

A printed wiring board includes a first conductor layer including a first conductor circuit and a second conductor circuit formed adjacent to the first conductor circuit, a resin insulating layer formed on the first conductor layer such that the insulating layer is filling space between the first and second conductor circuits, and a second conductor layer formed on the insulating layer such that the insulating layer is interposed between the first and second conductor layers. The first conductor layer has thickness in the range of 1 μm to 15 μm and is formed such that the space between the first and second conductor circuits has width in the range of 2 μm to 7 μm, and the insulating layer includes inorganic particles having average particle diameter in the range of 0.05 μm to 1.0 μm and content in the range of 35 wt. % to 75 wt. % in the insulating layer.

20 Claims, 1 Drawing Sheet

(51) Int. Cl.
*H05K 1/02* (2006.01)
*H05K 3/46* (2006.01)
*H05K 1/03* (2006.01)
*H01F 17/00* (2006.01)

(52) U.S. Cl.
CPC ....... H01F 27/2804 (2013.01); H05K 1/0204 (2013.01); H05K 3/46 (2013.01); *H01F 2027/2809* (2013.01); *H01L 2924/0002* (2013.01); *H05K 1/0271* (2013.01)

(58) Field of Classification Search
CPC ...... H01L 2924/181; H05K 1/02; H05K 1/03; H05K 1/056; H05K 1/0204; H05K 1/0271; H05K 1/0306; H05K 3/46; H05K 3/108; H05K 3/421; H05K 3/4614; H05K 3/4617; H05K 3/4652; H05K 3/4691; H05K 2201/068; H05K 2201/09509; H05K 2203/1105; Y10T 29/49002; Y10T 29/49117; Y10T 29/49124; Y10T 29/49155
USPC .............. 174/256; 257/772; 438/113; 29/846
See application file for complete search history.

(56) References Cited

U.S. PATENT DOCUMENTS

| | | | |
|---|---|---|---|
| 2012/0055015 A1* | 3/2012 | Toyoda | H01L 21/56 29/829 |
| 2012/0124829 A1* | 5/2012 | Kamei | G11B 5/486 29/846 |
| 2013/0015582 A1* | 1/2013 | Kondo | H01L 23/49816 257/772 |
| 2016/0174372 A1* | 6/2016 | Inagaki | H05K 1/113 174/251 |

\* cited by examiner

PRINTED WIRING BOARD

CROSS-REFERENCE TO RELATED APPLICATIONS

The present application is based upon and claims the benefit of priority to Japanese Patent Application No. 2016-181505, filed Sep. 16, 2016, the entire contents of which are incorporated herein by reference.

BACKGROUND OF THE INVENTION

Field of the Invention

The present invention relates to a printed wiring board having a resin insulating layer that contains inorganic particles.

Description of Background Art

Japanese Patent Laid-Open Publication No. 2015-176884 describes a printed wiring board having an interlayer insulating layer that contains inorganic particles. The entire contents of this publication are incorporated herein by reference.

SUMMARY OF THE INVENTION

According to one aspect of the present invention, a printed wiring board includes a first conductor layer including a first conductor circuit and a second conductor circuit formed adjacent to the first conductor circuit, a resin insulating layer formed on the first conductor layer such that the resin insulating layer is filling a space between the first conductor circuit and the second conductor circuit, and a second conductor layer formed on the resin insulating layer such that the resin insulating layer is interposed between the first conductor layer and the second conductor layer. The first conductor layer has a thickness in the range of 1 μm to 15 μm and is formed such that the space between the first conductor circuit and the second conductor circuit has a width in the range of 2 μm to 7 μm, and the resin insulating layer includes inorganic particles having an average particle diameter in the range of 0.05 μm to 1.0 μm and a content in the range of 35 wt. % to 75 wt. % in the resin insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
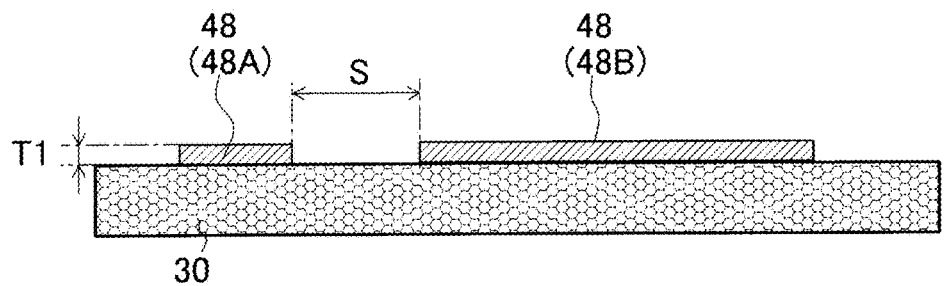
FIG. 1A-1C illustrate manufacturing process diagrams of a printed wiring board according to an embodiment of the present invention.

Embodiments will now be described with reference to the accompanying drawings, wherein like reference numerals designate corresponding or identical elements throughout the various drawings.

Embodiment

Figure 1B:
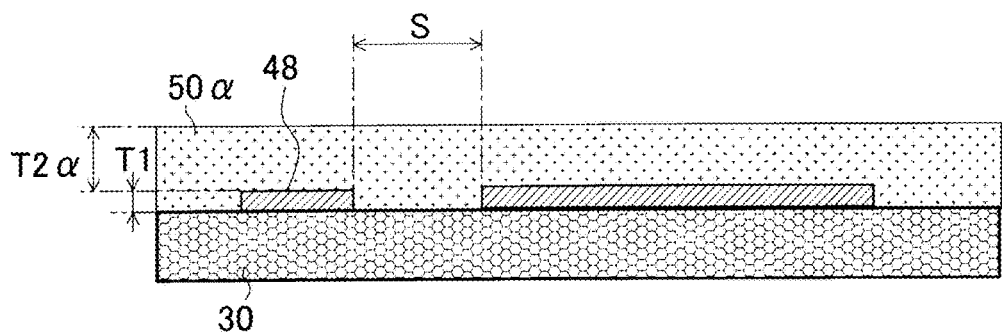
Figure 1C:
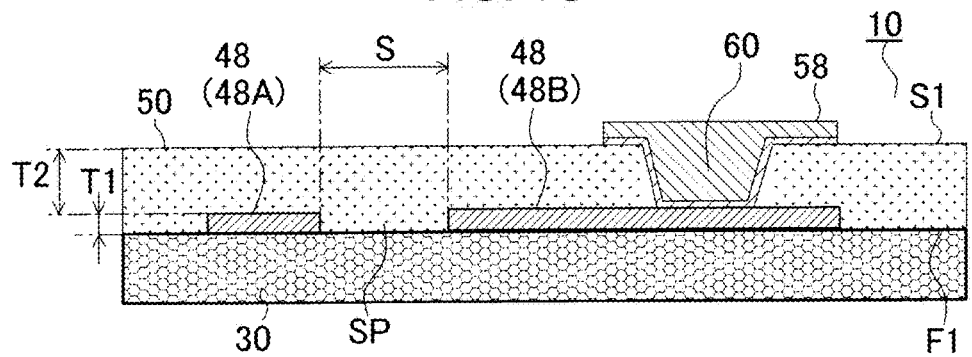

FIG. 1C illustrates a printed wiring board 10 of an embodiment.

The printed wiring board 10 includes: a resin insulating layer 50 that has a first surface (F1) and a second surface (S1) that is on an opposite side of the first surface (F1); a first conductor layer 48 and a second conductor layer 58 that sandwich the resin insulating layer 50; and a via conductor 60 that penetrates the resin insulating layer 50 and connects the first conductor layer 48 and the second conductor layer 58 to each other.

The first conductor layer 48 is formed on the first surface (F1) and is embedded in the resin insulating layer 50. The first conductor layer 48 has a thickness (T1). The thickness (T1) is 1 μm or more and 15 μm or less. An example of the thickness (T1) is 6 μm.

The first conductor layer 48 includes a first conductor circuit (48A), and a second conductor circuit (48B) adjacent to the first conductor circuit (48A). There is a space (SP) between the first conductor circuit (48A) and the second conductor circuit (48B). A distance between the first conductor circuit (48A) and the second conductor circuit (48B) is a distance (width) (S) of the space (SP). The width (S) is 2 μm or more and 7 μm or less. An example of the width (S) is 4 μm. The width (S) is preferably 5 μm or less. The printed wiring board 10 can be reduced in size.

The resin insulating layer 50 fills the space (SP). Further, the resin insulating layer 50 is formed between the first conductor layer 48 and the second conductor layer 58. The resin insulating layer 50 is formed on the first conductor layer 48.

The resin insulating layer 50 is formed of inorganic particles and resin. The resin insulating layer 50 may contain a curing agent as an additive. However, the resin insulating layer 50 preferably does not contain a reinforcing material formed of fibers. Examples of the reinforcing material include a glass cloth, glass fibers and resin fibers. The resin insulating layer 50 preferably dos not contain a reinforcing material other than spherical inorganic particles.

The resin insulating layer 50 contains multiple inorganic particles. Examples of the inorganic particles include silica and alumina particles. An average particle diameter (D1) of the inorganic particles contained in the resin insulating layer 50 is 0.05 μm or more and 1 μm or less. Among the multiple inorganic particles, a largest inorganic particle has a diameter (maximum particle diameter) (D2) of 1.2 μm or more and 1.8 μm or less. A content of the inorganic particles contained in the resin insulating layer 50 is 35 wt. % or more and 75 wt. % or less.

The resin insulating layer 50 has a thickness (T2). The thickness (T2) is a distance between the first conductor layer 48 and the second conductor layer 58. The thickness (T2) is 3 μm or more and 15 μm or less. An example of the thickness (T2) is 8 μm. The thickness (T2) is preferably 4.5 μm or more and 10.5 μm or less.

The second conductor layer 58 is formed on the second surface (S1), and protrudes from the second surface (S1).

In the printed wiring board of the embodiment, the average particle diameter (D1) of the inorganic particles contained in the resin insulating layer 50 is small. The maximum particle diameter (D2) is small. Therefore, when the resin insulating layer 50 is formed in the space (SP) and on the first conductor layer 48, viscosity of the resin insulating layer 50 is likely to become high. Further, the space between the first conductor circuit (48A) and the second conductor circuit (48B) is 2 μm or more and 7 μm or less, and thus, the space between the first conductor circuit (48A) and the second conductor circuit (48B) is narrow. Therefore, it is difficult to fill the space between the first conductor circuit (48A) and the second conductor circuit (48B) with the resin insulating layer 50. However, since the thickness (T1) of the first conductor layer 48 is 1 µm or more and 15 µm or less, the thickness (T1) of the first conductor circuit (48A) and the second conductor circuit (48B) is small. The thickness (T1) is preferably 7.5 µm or less. Therefore, even when the viscosity of the resin insulating layer 50 is high, the space (SP) between the first conductor circuit (48A) and the second conductor circuit (48B) can be easily filled with the resin insulating layer 50. Voids are unlikely to occur in the resin insulating layer 50 formed in the space between the first conductor circuit (48A) and the second conductor circuit (48B). Further, since the thickness (T2) of the resin insulating layer 50 is 3 µm or more and 15 µm or less, the thickness (T2) is small. Therefore, a force such as a pressure easily transmits to the resin insulating layer 50 in the space (SP). Therefore, voids are unlikely to remain in the resin insulating layer 50 in the space (SP). Further, even when voids enter into the resin insulating layer 50 in the space (SP), the voids are likely to move to outside.

FIG. 1A-1D illustrate a method for manufacturing the printed wiring board 10 according to the embodiment.

The first conductor layer 48 including the first conductor circuit (48A) and the second conductor circuit (48B) is formed on a substrate 30 (FIG. 1A). In the embodiment, the thickness (T1) of the first conductor layer 48 is 2 µm or more and 12 µm or less. A thickness of the printed wiring board 10 can be reduced. In another embodiment, the thickness (T1) is 5 µm. The width (S) of the space (SP) between the first conductor circuit (48A) and the second conductor circuit (48B) is 3 µm or more and 7 µm or less. The width (S) is preferably 3 µm or more and 5 µm or less. In the embodiment, the width (S) is 5 µm.

A resin film (50α) for forming the resin insulating layer 50 is prepared. The resin film (50α) is laminated on the first conductor layer 48 and the substrate 30 by hot pressing. In this case, since the resin film (50α) becomes softer, the space (SP) is filled with the resin film (50α) (FIG. 1B). Thereafter, the resin film (50α) cures. The resin insulating layer 50 is formed in the space (SP) and on the first conductor layer 48. For example, the thickness (T2) is 6 µm, and the content of the inorganic particles in the resin insulating layer 50 is 70 wt. %. The inorganic particles are silica particles and have spherical shapes. The diameter (D1) is 0.07 µm, and the diameter (D2) is 1.5 µm.

An opening 52 is formed in the resin insulating layer 50 using $CO_2$ laser. Thereafter, the second conductor layer 58 is formed on the second surface (S1) of the resin insulating layer 50 using a semi-additive method. At the same time, the via conductor 60 that connects the first conductor layer 48 and the second conductor layer 58 is formed in the opening 52 (FIG. 1C).

Figure 1D:
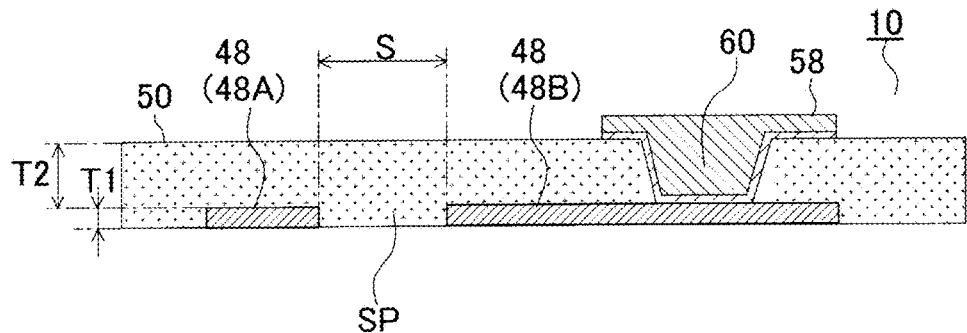
FIG. 1D illustrates a printed wiring board of another example.

The substrate 30 may be a circuit substrate having a conductor layer, a resin insulating layer and a via conductor. Or, the substrate 30 may be a carrier for forming the printed wiring board 10. When the substrate 30 is a carrier, the carrier is removed, and the printed wiring board (printed wiring board of another example) illustrated in FIG. 1D is obtained.

In Japanese Patent Laid-Open Publication No. 2015-176884, a content of the inorganic filler is 25-55 wt. %. Japanese Patent Laid-Open Publication No. 2015-176884 describes the content of the inorganic filler and voids between conductor circuits. It appears that Japanese Patent Laid-Open Publication No. 2015-176884 considers a cause of the voids between the conductor circuits to be the content of the inorganic filler, thereby not leading to conduct studies of methods other than those that simply narrow a content range of the inorganic filler as a method for improving the problem of voids.

A printed wiring board according to an embodiment of the present invention includes: a first conductor layer that includes a first conductor circuit and a second conductor circuit that is adjacent to the first conductor circuit; a resin insulating layer that fills a space between the first conductor circuit and the second conductor circuit, and is formed on the first conductor layer; and a second conductor layer that is formed on the resin insulating layer. The first conductor layer has a thickness of 1 µm or more and 15 µm or less. The space has a width of 2 µm or more and 7 µm or less. The resin insulating layer contains multiple inorganic particles. The multiple inorganic particles have an average particle diameter of 0.05 µm or more and 1.0 µm or less. A content of the inorganic particles contained in the resin insulating layer is 35 wt. % or more and 75 wt. % or less.

The average particle diameter of the inorganic particles contained in the resin insulating layer of the printed wiring board according to an embodiment of the present invention is 0.05 µm or more and 1.0 µm or less. Therefore, viscosity of the resin insulating layer is likely to become high. Further, the width of the space between the first conductor circuit and the second conductor circuit is 2 µm or more and 7 µm or less, and thus, the space between the first conductor circuit and the second conductor circuit is narrow. Therefore, it is difficult to fill the space between the first conductor circuit and the second conductor circuit with the resin insulating layer. However, since the thickness of the first conductor layer is 1 µm or more and 15 µm or less, the thickness of the first conductor circuit and the second conductor circuit is small. Therefore, even when the viscosity of the resin insulating layer is high, the space between the first conductor circuit and the second conductor circuit can be easily filled with the resin insulating layer. Voids are unlikely to occur in the space between the first conductor circuit and the second conductor circuit.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
   a first conductor layer comprising a first conductor circuit and a second conductor circuit forming adjacent to the first conductor circuit;
   a resin insulating layer formed on the first conductor layer such that the resin insulating layer is filling a space between the first conductor circuit and the second conductor circuit; and
   a second conductor layer formed on the resin insulating layer such that the resin insulating layer is interposed between the first conductor layer and the second conductor layer,
   wherein the first conductor layer has a thickness in a range of 1 µm to 15 µm and is formed such that the space between the first conductor circuit and the second conductor circuit has a width in a range of 2 µm to 7 µm, and the resin insulating layer comprises inorganic particles having an average particle diameter in a range of 0.05 µm to 1.0 µm and a content in a range of 35 wt.

% to 75 wt. % in the resin insulating layer and does not contain reinforcing material comprising fibers.

2. A printed wiring board according to claim 1, wherein the inorganic particles have a maximum diameter of 1.8 μm or less.

3. A printed wiring board according to claim 1, wherein the resin insulating layer has a thickness in a range of 3 μm to 15 μm.

4. A printed wiring board according to claim 1, wherein the resin insulating layer has a thickness in a range of 3 μm to 10.5 μm.

5. A printed wiring board according to claim 2, wherein the resin insulating layer has a thickness in a range of 3 μm to 15 μm.

6. A printed wiring board according to claim 2, wherein the resin insulating layer has a thickness in a range of 3 μm to 10.5 μm.

7. A printed wiring board according to claim 1, wherein the resin insulating layer has a thickness in a range of 4.5 μm to 10.5 μm.

8. A printed wiring board according to claim 2, wherein the resin insulating layer has a thickness in a range of 4.5 μm to 10.5 μm.

9. A printed wiring board according to claim 1, wherein the first conductor layer has the thickness of 7.5 μm or less.

10. A printed wiring board according to claim 2, wherein the first conductor layer has the thickness of 7.5 μm or less.

11. A printed wiring board according to claim 3, wherein the first conductor layer has the thickness of 7.5 μm or less.

12. A printed wiring board according to claim 1, wherein the resin insulating layer comprises the inorganic particles comprising silica particles.

13. A printed wiring board according to claim 2, wherein the resin insulating layer comprises the inorganic particles comprising silica particles.

14. A printed wiring board according to claim 3, wherein the resin insulating layer comprises the inorganic particles comprising silica particles.

15. A printed wiring board according to claim 1, wherein the first conductor layer is formed such that the space between the first conductor circuit and the second conductor circuit has the width in a range of 3 μm to 7 μm.

16. A printed wiring board according to claim 2, wherein the first conductor layer is formed such that the space between the first conductor circuit and the second conductor circuit has the width in a range of 3 μm to 5 μm.

17. A printed wiring board according to claim 1, wherein the first conductor layer has the thickness of 7.5 μm or less, and the first conductor layer is formed such that the space between the first conductor circuit and the second conductor circuit has the width in a range of 3 μm to 7 μm.

18. A printed wiring board according to claim 2, wherein the first conductor layer has the thickness of 7.5 μm or less, and the first conductor layer is formed such that the space between the first conductor circuit and the second conductor circuit has the width in a range of 3 μm to 7 μm.

19. A printed wiring board according to claim 3, wherein the first conductor layer has the thickness of 7.5 μm or less, and the first conductor layer is formed such that the space between the first conductor circuit and the second conductor circuit has the width in a range of 3 μm to 7 μm.

20. A printed wiring board according to claim 5, wherein the first conductor layer has the thickness of 7.5 μm or less, and the first conductor layer is formed such that the space between the first conductor circuit and the second conductor circuit has the width in a range of 3 μm to 7 μm.

* * * * *